US010969691B2

(12) United States Patent
Lee et al.

(10) Patent No.: US 10,969,691 B2
(45) Date of Patent: Apr. 6, 2021

(54) EXTREME ULTRAVIOLET EXPOSURE APPARATUS AND METHOD, AND METHOD OF MANUFACTURING SEMICONDUCTOR DEVICE BY USING THE EXPOSURE METHOD

(71) Applicant: Samsung Electronics Co., Ltd., Suwon-si (KR)

(72) Inventors: Seung-yoon Lee, Seoul (KR); Doo-gyu Lee, Ansan-si (KR); Chan-sam Chang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/004,199

(22) Filed: Aug. 27, 2020

(65) Prior Publication Data

US 2020/0393767 A1    Dec. 17, 2020

Related U.S. Application Data

(62) Division of application No. 16/406,513, filed on May 8, 2019.

(30) Foreign Application Priority Data

Oct. 18, 2018   (KR) .......................... 10-2018-0124576

(51) Int. Cl.
G03F 7/20      (2006.01)
G03F 1/24      (2012.01)
H05G 2/00      (2006.01)

(52) U.S. Cl.
CPC ............ *G03F 7/70033* (2013.01); *G03F 1/24* (2013.01); *G03F 7/2008* (2013.01);
(Continued)

(58) Field of Classification Search
CPC .. G03F 7/70033; G03F 7/7015; G03F 7/2008; G03F 7/70891; G03F 7/70883; G03F 1/24; H05G 2/008
(Continued)

(56) References Cited

U.S. PATENT DOCUMENTS 7,193,794 B2   3/2007  Beck et al.
8,766,212 B2   7/2014  Frijns
(Continued)

FOREIGN PATENT DOCUMENTS

JP    2016-092208 A   5/2016
KR    10-2013-023423 A  11/2013

*Primary Examiner* — Kiet T Nguyen
(74) *Attorney, Agent, or Firm* — Harness, Dickey & Pierce, P.L.C.

(57) ABSTRACT

Extreme ultraviolet (EUV) exposure apparatuses and methods, and methods of manufacturing a semiconductor device by using the exposure method, which minimize an error caused by a mirror in an EUV exposure process to improve an overlay error, are provided. The EUV exposure apparatus includes an EUV source configured to generate and output EUV, first illumination optics configured to transfer the EUV to an EUV mask, projection optics configured to project the EUV, reflected from the EUV mask, onto an exposure target, a laser source configured to generate and output a laser beam for heating, and second illumination optics configured to irradiate the laser beam onto at least one mirror included in the projection optics.

8 Claims, 18 Drawing Sheets

(52) U.S. Cl.
CPC ........ *G03F 7/7015* (2013.01); *G03F 7/70883* (2013.01); *G03F 7/70891* (2013.01); *H05G 2/008* (2013.01)

(58) Field of Classification Search
USPC ..................................................... 250/492.2
See application file for complete search history.

(56) References Cited

U.S. PATENT DOCUMENTS

| | | |
|---|---|---|
| 9,087,698 B2 | 7/2015 | Kim et al. |
| 9,263,161 B2 | 2/2016 | Clauss |
| 9,316,929 B2 | 4/2016 | Baer et al. |
| 9,389,180 B2 | 7/2016 | Chilese et al. |
| 9,442,381 B2 | 9/2016 | Conradi et al. |
| 9,671,703 B2 | 6/2017 | Baer et al. |
| 9,891,525 B2 | 2/2018 | Yabu |
| 9,952,440 B2 | 4/2018 | Matsumoto |
| 10,031,423 B2 | 7/2018 | Baer et al. |
| 2005/0110967 A1 | 5/2005 | Hara et al. |
| 2005/0128446 A1 | 6/2005 | Miyajima |
| 2007/0252959 A1 | 11/2007 | Schwertner et al. |
| 2008/0212183 A1 | 9/2008 | Uitterdijk et al. |
| 2011/0181850 A1 | 7/2011 | Bach et al. |
| 2012/0105865 A1 | 5/2012 | Patra |
| 2013/0070221 A1 | 3/2013 | Bittner et al. |
| 2013/0230073 A1* | 9/2013 | Vogt .................. G01B 9/02024 374/45 |
| 2014/0047397 A1 | 2/2014 | Ye et al. |
| 2016/0334719 A1 | 11/2016 | Schwertner et al. |
| 2016/0377988 A1 | 12/2016 | Paul et al. |

\* cited by examiner

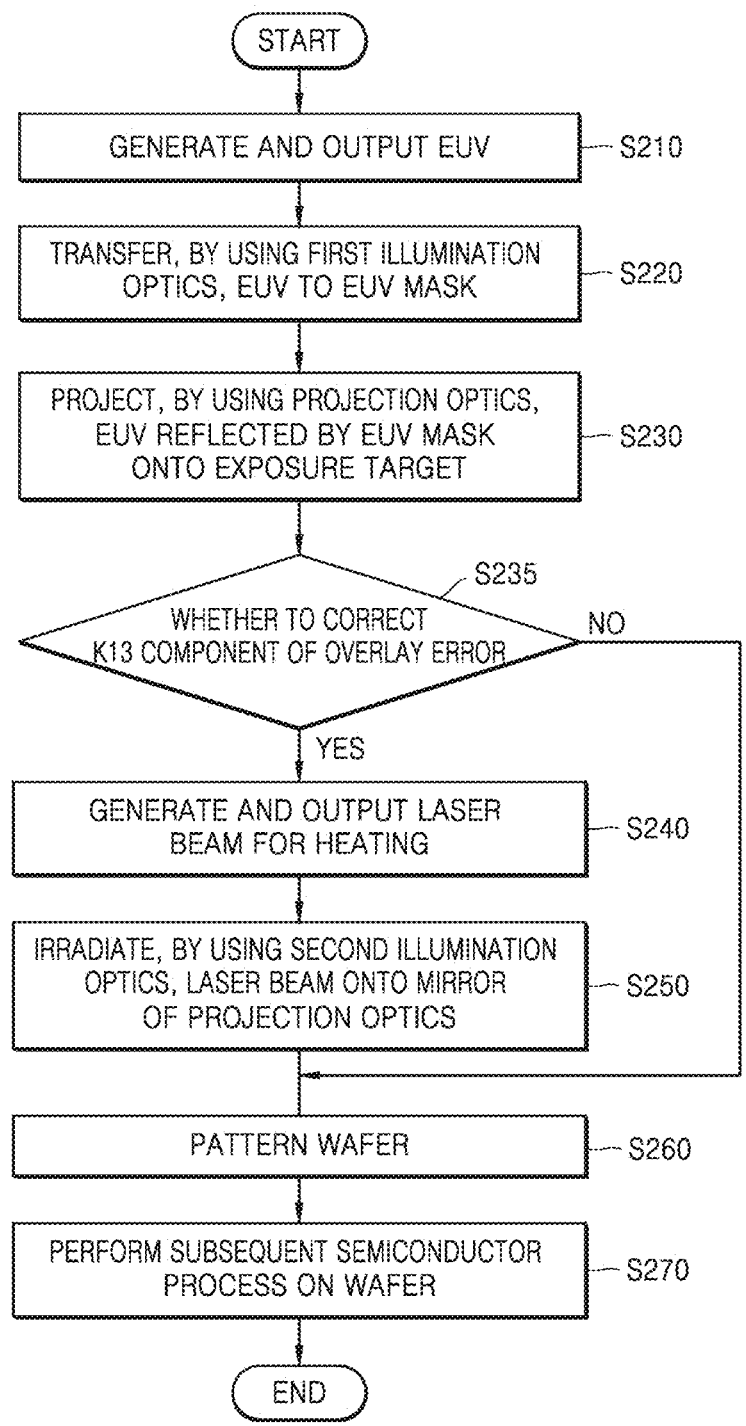

EXTREME ULTRAVIOLET EXPOSURE APPARATUS AND METHOD, AND METHOD OF MANUFACTURING SEMICONDUCTOR DEVICE BY USING THE EXPOSURE METHOD

CROSS-REFERENCE TO RELATED APPLICATION

This application is a divisional of U.S. application Ser. No. 16/406,513, filed on May 8, 2019, which claims the benefit of Korean Patent Application No. 10-2018-0124576, filed on Oct. 18, 2018, in the Korean Intellectual Property Office, the disclosure of each of which is incorporated herein in its entirety by reference.

BACKGROUND

The inventive concepts relate to exposure apparatuses and/or exposure methods, and more particularly, to an exposure apparatuses and/or methods using extreme ultraviolet (EUV).

Recently, as a semiconductor circuit line width becomes finer, a light source having a shorter wavelength is needed. For example, EUV is being used as an exposure light source. Due to an absorption characteristic of EUV, a reflective EUV mask is being used in an EUV exposure process. Also, illumination optics for transferring EUV to an EUV mask and projection optics for projecting EUV reflected from the EUV mask onto an exposure target may each include a plurality of mirrors. As a technical level of an exposure process increases progressively, a small error occurring in the EUV mask or the mirrors may cause a severe error in forming a pattern on a wafer.

SUMMARY

The inventive concepts provide extreme ultraviolet (EUV) exposure apparatuses, EUV exposure methods, and/or methods of manufacturing a semiconductor device by using the exposure method, which mitigate or minimize an error caused by a mirror in an EUV exposure process to reduce an overlay error.

According to an example embodiment of the inventive concepts, an extreme ultraviolet (EUV) exposure apparatus includes an EUV source configured to generate and output EUV, first illumination optics configured to transfer the EUV to an EUV mask, projection optics configured to project the EUV reflected from the EUV mask onto an exposure target, a laser source configured to generate and output a laser beam, and second illumination optics configured to irradiate the laser beam onto at least one mirror included in the projection optics.

According to an example embodiment of the inventive concepts, an extreme ultraviolet (EUV) exposure apparatus includes an EUV source configured to generate and output EUV, first illumination optics configured to transfer the EUV to an EUV mask, projection optics configured to project the EUV reflected from the EUV mask onto an exposure target, a stage configured to receive the exposure target thereon, and laser apparatus configured to generate a laser beam, and irradiate the laser beam onto at least one mirror included in the projection optics for heating the at least one mirror.

According to an example embodiment of the inventive concepts, an extreme ultraviolet (EUV) exposure method includes generating and outputting, by using an EUV source, EUV, transferring, by using first illumination optics, the EUV to an EUV mask, projecting, by using projection optics, the EUV reflected from the EUV mask onto an exposure target, generating and outputting, by using laser apparatus, a laser beam, forming, by using second illumination optics, an illumination shape of the laser beam, and irradiating the laser beam having the illumination shape onto at least one mirror included in the projection optics.

According to an example embodiment of the inventive concepts, a method of manufacturing a semiconductor device includes generating and outputting EUV by using an extreme ultraviolet (EUV) source, transferring, by using first illumination optics, the EUV to an EUV mask, projecting, by using projection optics, the EUV reflected from the EUV mask onto a wafer, the wafer being an exposure target, generating and outputting, by using laser apparatus, a laser beam, forming, by using second illumination optics, an illumination shape of the laser beam, irradiating the laser beam having the illumination shape onto at least one mirror included in the projection optics, patterning the wafer, and performing a subsequent semiconductor process on the wafer.

BRIEF DESCRIPTION OF THE DRAWINGS

Example embodiments of the inventive concepts will be more clearly understood from the following detailed description taken in conjunction with the accompanying drawings in which:

FIG. 13 is a flowchart illustrating a procedure of a method of manufacturing a semiconductor device by using the exposure method of FIG. 11.

DETAILED DESCRIPTION

Figure 1:
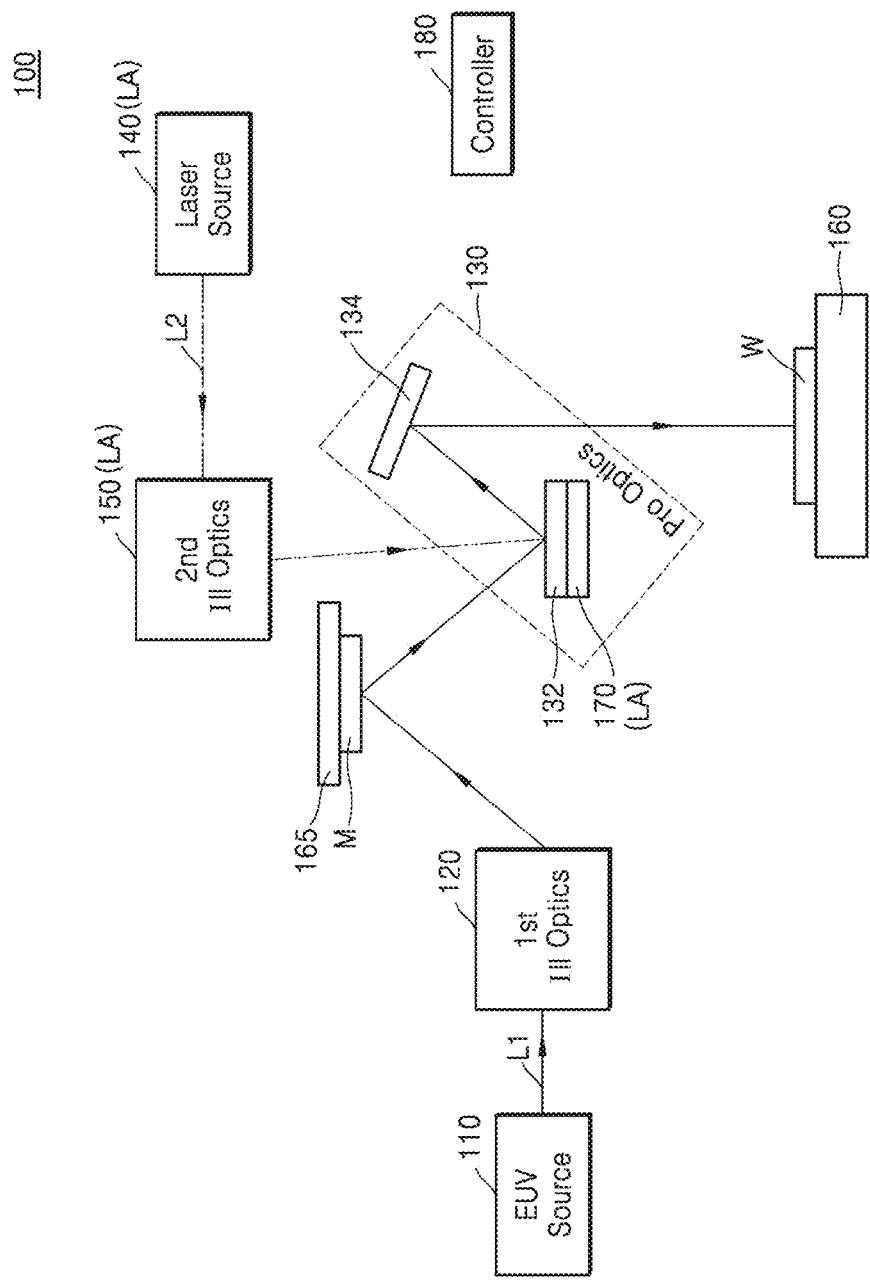
FIG. 1 is a conceptual view illustrating an EUV exposure apparatus according to an example embodiment.

Hereinafter, some example embodiments will be described in detail with reference to the accompanying drawings. Like reference numerals refer to like elements, and their repetitive descriptions will be omitted.

Figure 2A:
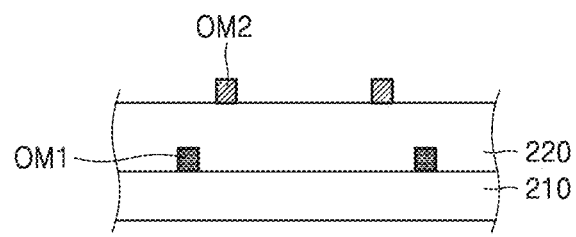
FIGS. 2A and 2B are cross-sectional views for describing an overlay error.
Figure 2B:
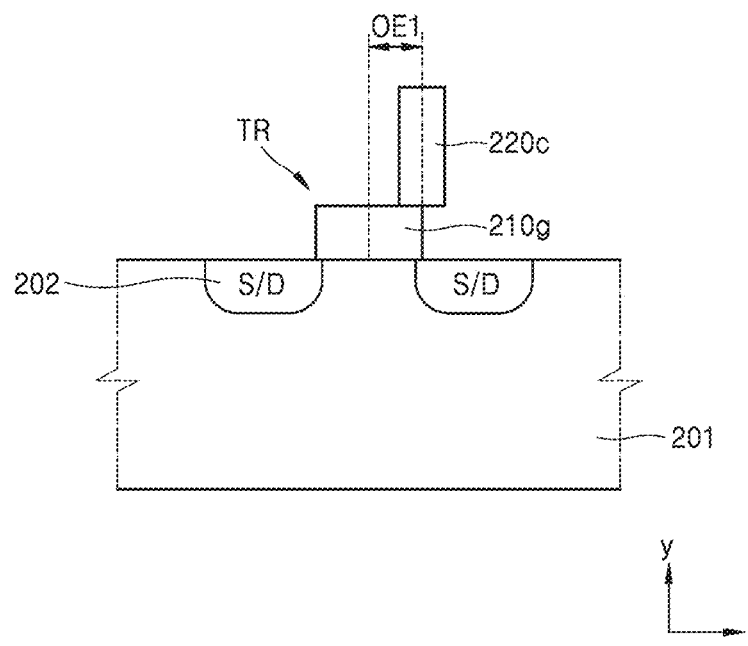

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. FIG. 1 is a conceptual view illustrating an extreme ultraviolet (EUV) exposure apparatus 100 according to an example embodiment. FIGS. 2A and 2B are cross-sectional views for describing an overlay error.

Referring to FIGS. 1 to 2B, the EUV exposure apparatus 100 according to the present example embodiment may include an EUV source 110, first illumination optics (1st Ill Optics) 120, projection optics (Pro Optics) 130, a laser source 140, second illumination optics (2nd Ill Optics) 150, a wafer stage 160, and a controller 180.

The EUV source 110 may generate and output EUV L1 having a high energy density within a wavelength range of about 5 nm to about 50 nm. For example, the EUV source 110 may generate and output the EUV L1 having a high energy density corresponding to a wavelength of 13.5 nm. The EUV source 110 may include a plasma-based light source or a synchrotron radiation light source. Here, the plasma-based light source may denote a light source that generates plasma and uses light emitted based on the plasma. For example, the plasma-based light source may be a laser-produced plasma (LPP) light source or a discharge-produced plasma (DPP) light source. In the EUV exposure apparatus 100 according to the present example embodiment, the EUV source 100 may include, for example, a plasma-based light source. However, in the EUV exposure apparatus 100 according to the present example embodiment, the EUV source 110 is not limited to a plasma-based light source. In order to increase an energy density of illumination light incident on the first illumination optics 120, the plasma-based light source may include a condensing mirror such as an elliptical mirror and/or a spherical mirror condensing EUV.

The first illumination optics 120 may include a plurality of mirrors, and may transfer the EUV L1 emitted from the EUV source 110 to an EUV mask M. For example, the EUV L1 from the EUV source 110 may be reflected by the mirrors of the first illumination optics 120a, and may be incident on the EUV mask M disposed on a mask supporter 165.

The EUV mask M may be a reflective mask that includes a reflection region and a non-reflection and/or intermediate reflection region. The EUV mask M may include a pattern including a reflection multilayer for reflecting EUV on a substrate including a low thermal expansion coefficient material (LTEM) such as quartz, and an absorption layer provided on the reflection multilayer. The reflection multilayer may have a structure where a molybdenum (Mo) layer and a silicon (Si) layer are alternately stacked in tens or more of layers. The absorption layer may include, for example, TaN, TaNO, TaBO, nickel (Ni), gold (Au), silver (Ag), carbon (C), tellurium (Te), platinum (Pt), palladium (Pd), chromium (Cr), and/or the like. However, a material of the reflection multilayer and a material of the absorption layer are not limited to the above-described materials. Here, the absorption layer may correspond to the non-reflection and/or intermediate reflection region.

The EUV mask M may reflect the EUV L1 incident through the first illumination optics 120 to allow the EUV L1 to be incident on the projection optics 130. In more detail, the EUV mask M may structurize illumination light from the first illumination optics 120 to generate projection light based on a shape of the pattern including the reflection multilayer and the absorption layer on the substrate, and may allow the projection light to be incident on the projection optics 130. The projection light may be structurized through at least second diffraction order based on the pattern on the EUV mask M. The projection light may be incident on the projection optics 130 while retaining information about a shape of the pattern of the EUV mask M, and may pass through the projection optics 130 to form an image, corresponding to the pattern of the EUV mask M on an exposure target W. Here, the exposure target W may be a substrate (for example, a wafer) including a semiconductor material such as Si. Hereinafter, the exposure target W and a wafer may be used interchangeably. Thus, reference numeral 'W' may also refer to a wafer. The exposure target W may be disposed on the wafer stage 160. The wafer stage 160 may move in an x direction and a y direction on an x-y plane in a Cartesian coordinate system, and may move in a z direction vertical to the x-y plane. Therefore, as the wafer stage 160 moves, the exposure target W may move in the x direction, the y direction, and the z direction.

The projection optics 130 may include a plurality of mirrors. In FIG. 1, the projection optics 130 is illustrated as including two mirrors (for example, a first mirror 132 and a second mirror 134), but this is for convenience. In other example embodiments, the projection optics 130 may include more mirrors. For example, the projection optics 130 may include four to eight mirrors generally. However, the number of mirrors included in the projection optics 130 is not limited thereto.

The laser source 140 may generate, and output a mirror-heating laser beam L2. The laser source 140 may include, for example, an infrared (IR) laser source for generating an IR laser beam and an ultraviolet (UV) laser source for generating a UV laser beam. However, a kind of the laser source 140 is not limited thereto. For example, in the EUV exposure apparatus 100 according to the present example embodiment, examples of the laser source 140 may include various kinds of laser sources for generating the laser beam L2 that satisfies the following conditions. Conditions of the laser beam L2 may include a condition for applying energy to a mirror to heat the mirror and a condition having a wavelength which does not change chemical properties of a photoresist on the exposure target W. In some example embodiments, an EUV exposure process may be performed along with an ArF immersion (ArFi) exposure process, and the laser beam L2 may not include a wavelength of EUV used in the EUV exposure process and a wavelength of deep UV (DUV) used in the ArFi exposure process.

The second illumination optics 150 may transfer the laser beam L2 emitted from the laser source 140 to at least one mirror of the projection optics 130. For example, the laser beam L2 of the laser source 140 may be directly irradiated onto the first mirror 132 of the projection optics 130 through the second illumination optics 150. In some example embodiments, the laser beam L2 may be directly irradiated onto another mirror, other than the first mirror 132, of the projection optics 130 through the second illumination optics 150.

The second illumination optics 150 may include a plurality of mirrors and an optical device having various functions. The second illumination optics 150 may form an illumination shape of the laser beam L2 of the laser source 140 by using the mirrors and the optical device. In this manner, in the exposure apparatus 100 according to the present example embodiment, the second illumination optics 150 may form an illumination shape of the laser beam L2, the laser beam L2 may be irradiated onto a partial region of, for example, the first mirror 132, and thus the partial region of the first mirror 132 may be heated. An example where the second illumination optics 150 forms an illumination shape of the laser beam L2 will be described below in more detail with reference to FIGS. 8A to 9C.

A temperature sensor 170 for measuring a temperature of a portion or an entirety of a mirror may be disposed on a rear surface of the first mirror 132 onto which the laser beam L2 is irradiated. The temperature sensor 170 may measure a temperature of the first mirror 132, and thus an amount of heat or energy applied to the first mirror 132 may be calculated. For example, in the EUV exposure process, the temperature sensor 170 may calculate the first amount of energy based on the EUV L1 applied to the first mirror 132, and may calculate the second amount of energy to be applied to the first mirror 132 by the laser beam L2 based on the first calculated amount of energy. The temperature sensor 170 may calculate a temperature and an amount of energy based on the EUV L1 in each portion of the first mirror 132. Because the temperature and an amount of energy of each portion of the first mirror 132 are calculated, a region, to which energy is to be applied by the laser beam L2 of the first mirror 132 may be determined and the amount of energy to be applied to the determined region may be calculated. In a case of measuring temperatures of respective portions of the first mirror 132, a plurality of temperature sensors 170 may be disposed on the rear surface of the first mirror 132 in correspondence with the portions of the first mirror 132, respectively.

The temperature sensor 170 has been described above as being disposed only on the first mirror 132, but is not limited thereto. In other example embodiments, the temperature sensor 170 may be disposed on other mirrors of the EUV exposure apparatus 100. For example, the temperature sensor 170 may be disposed on other mirrors of the projection optics 130 and/or mirrors of the first illumination optics 120. According to an example embodiment, the laser beam L2 may be transferred to mirrors disposed along a path of the laser beam L2, in addition to the first mirror 132, and finally transferred to the photoresist on the exposure target W. Thus, a certain amount of energy may be applied to other mirrors, other than the first mirror 132, of the projection optics 130 by the laser beam L2. Therefore, in a case where the plurality of temperature sensors 170 are disposed on mirrors, respectively, energy applied by the EUV beam L1 and/or the laser beam L2 may be calculated. As described above, because the laser beam L2 has to be configured not to change the chemical properties of the photoresist on the exposure target W, the laser beam L2 may have a wavelength that does not change the chemical properties. For example, in a case where the photoresist on the exposure target W chemically reacts with a wavelength of EUV and/or a wavelength of DUV, the laser beam L2 may have a wavelength other than the wavelength of EUV and the wavelength of DUV.

A controller 180 for controlling various operations of the EUV exposure apparatus 100 (e.g., operations of (and/or calculations for) the EUV source 110, the first illumination optics (1st Ill Optics) 120, the projection optics (Pro Optics) 130, the laser source 140, the second illumination optics (2nd Ill Optics) 150, and/or a wafer stage 160) may be included in the EUV exposure apparatus 100.

Figure 11:
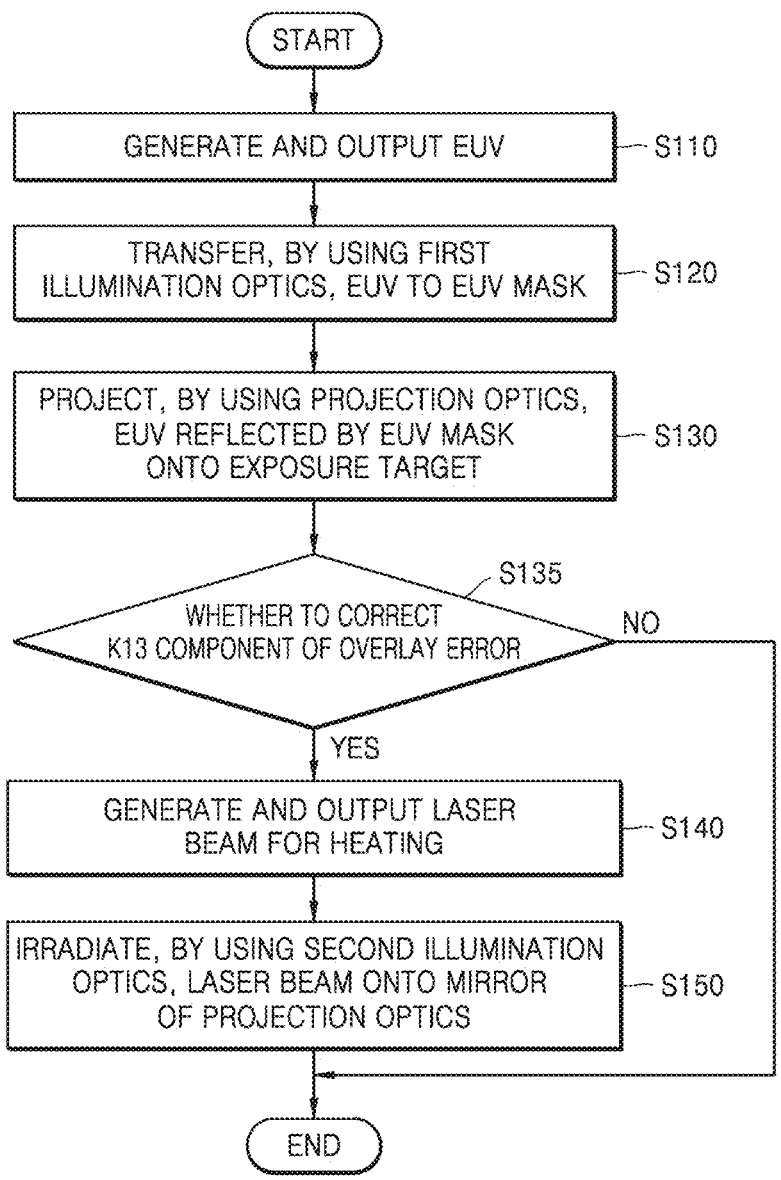
FIGS. 11 and 12 are flowcharts illustrating procedures of an EUV exposure method according to some example embodiments.
Figure 12:
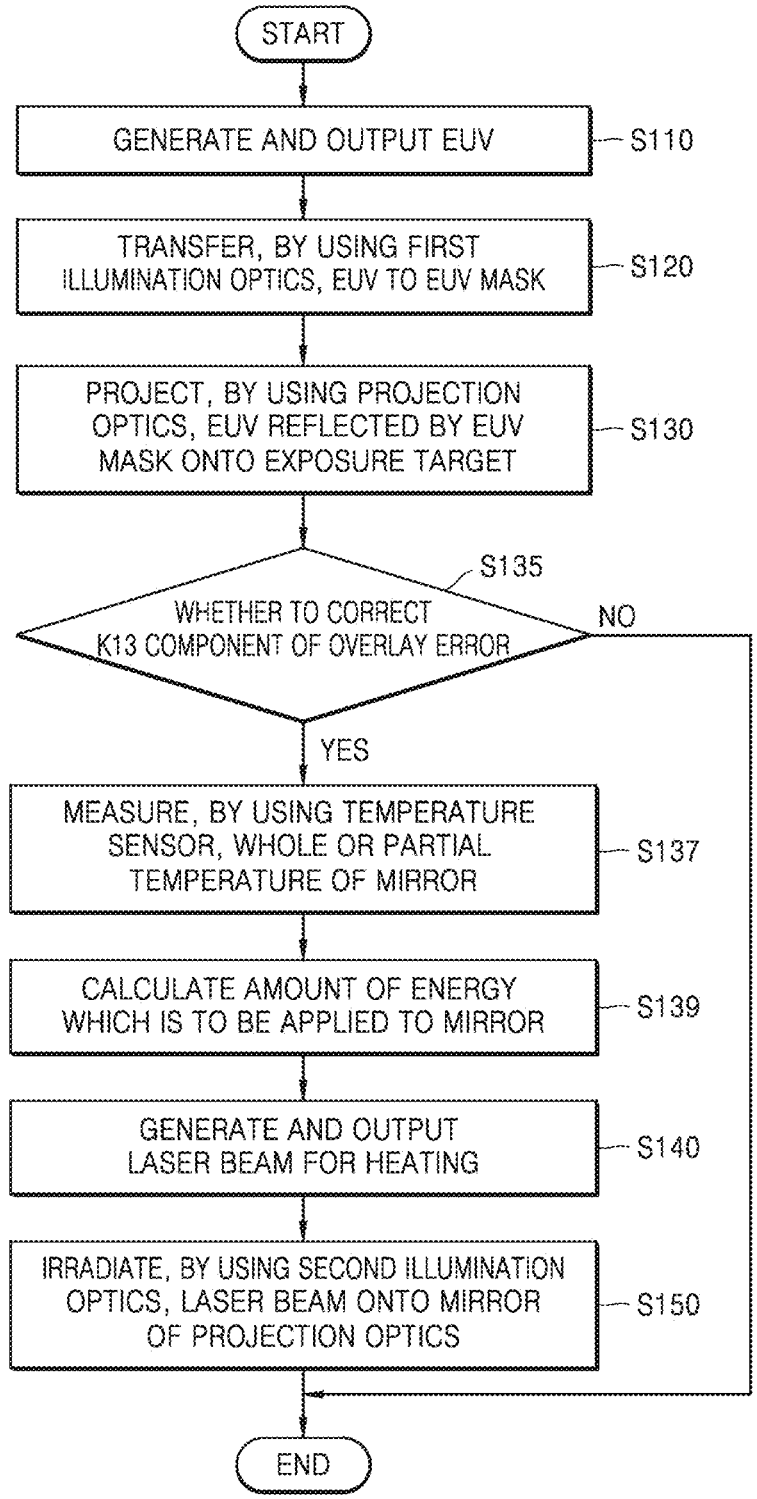

The controller 180 may be implemented with processing circuitry, such as hardware including logic circuits, a processing unit including software and a core executing the software, or a combination of the hardware and the processing unit, that is configured to control some or all of, for example, the operations illustrated in FIGS. 11-13. For example, the processing circuitry may include, but is not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

In the EUV exposure apparatus 100 according to the present example embodiment, the laser source 140, the second illumination optics 150, and the temperature sensor 170 may configure laser apparatus LA for heating a mirror.

The EUV exposure apparatus 100 according to the present example embodiment may heat at least one mirror of the projection optics 130 with the laser beam L2 by using the laser apparatus LA, thereby minimizing an overlay error caused by a mirror. Here, in the EUV exposure process, a mirror heated by the laser beam L2 of the laser apparatus LA may correspond to a mirror that causes an overlay error due to non-uniform heating by the EUV L1. For example, a mirror heated by the laser beam L2 of the laser apparatus LA may correspond to a mirror associated with a component of an overlay error incapable of being remedied through physical actuation.

For reference, an overlay may denote a degree to which a current layer corresponding to an upper layer overlaps an under layer. In an exposure process performed on the upper layer, a shot is performed so as to coincide with the under layer as much as possible based on an overlay mask of the under layer, thereby minimizing the overlay error. When the overlay error is large (e.g., when a relative position difference between the under layer and the current layer is large) an adverse effect may be exerted on the performance of a semiconductor device.

Referring to FIGS. 2A and 2B, a relative position difference a first overlay mark OM1 provided on a first layer 210, which is an under layer, and a second overlay mark OM2 provided on a second layer 220, which is an upper layer, may be measured may be calculated for calculating the overlay error. The first overlay mark OM1 may be formed simultaneously when a pattern is formed on the first layer 210, and the second overlay mark OM2 may be formed simultaneously when a pattern is formed on the second layer 220. An overlay mark may be formed in a box pattern shape or a bar pattern shape, and may be formed on a scribe lane of a wafer. However, a shape or a position of the overlay mark is not limited thereto.

FIG. 2B illustrates a semiconductor device provided on a semiconductor substrate 201. For example, a transistor TR including source/drain regions 202 and a gate electrode 210g may be formed on the semiconductor substrate 201, and a vertical contact 220c connected to the gate electrode 210g may be formed. The gate electrode 210g may correspond to a pattern provided on a first layer 210 which is an under layer, and the vertical contact 220c may correspond to a pattern provided on a second layer 220, which is an upper layer. When there is no overlay error, the vertical contact 220c may be disposed in a center portion of the gate electrode 210g in a first direction (an x direction). However, as illustrated in FIG. 2B, the gate electrode 210g and the vertical contact 220c may have a first overlay error OE1 in the first direction (the x direction) due to various causes. When the first overlay error OE1 is large, the vertical contact 220c may deviate from the gate electrode 210g and may be connected to the source/drain region 202, or the vertical contact 220c may overlap only a portion of the gate electrode 210g and may be connected to the gate electrode 210g and the source/drain region 202. A connection structure of the vertical contact 220c having the first overlay error OE1 may cause a severe error such as an open defect and/or a short circuit defect.

Components of an overlay error may be variously differentiated from one another, and particularly, due to a hardware limitation of an EUV scanner or an EUV exposure apparatus, some of the components of the overlay error is impossible to correct. For example, a K13 component of the overlay error may denote overlay distortion having a three-dimensional (3D) function shape in the x direction vertical to a scan direction, and in a conventional ArFi scanner, the K13 component may be corrected. However, the EUV scanner has a hardware (HW) structure which differs from that of the ArFi scanner, and thus, in the EUV scanner, a mirror has to largely move by about 100 mm to about 150 mm so as to compensate for the K13 component corresponding to a level of 0.5 nm. Therefore, in the EUV exposure process, the K3 component of the overlay error may be classified as a component impossible to correct. Various components of the overlay error will be described in more detail with reference to FIGS. 3A to 3C.

The EUV exposure apparatus 100 according to the present example embodiment may heat a portion of at least one mirror of the projection optics 130 with the laser beam L2 by using the second illumination optics 150 of the laser apparatus LA, thereby minimizing an overlay error caused by a non-uniform temperature distribution of a mirror in the EUV exposure process. For example, the EUV exposure apparatus 100 according to the present example embodiment may heat a portion of a mirror, corresponding to a cause of a K13 component of overlay error components, of the projection optics 130 with the laser beam L2 by using the second illumination optics 150 of the laser apparatus LA, thereby correcting the K13 component. In addition to the correction of the K13 component, the other components of the overlay error may be corrected through a conventional method, thereby reducing or minimizing an overlay error of the exposure target W.

Figure 3A:
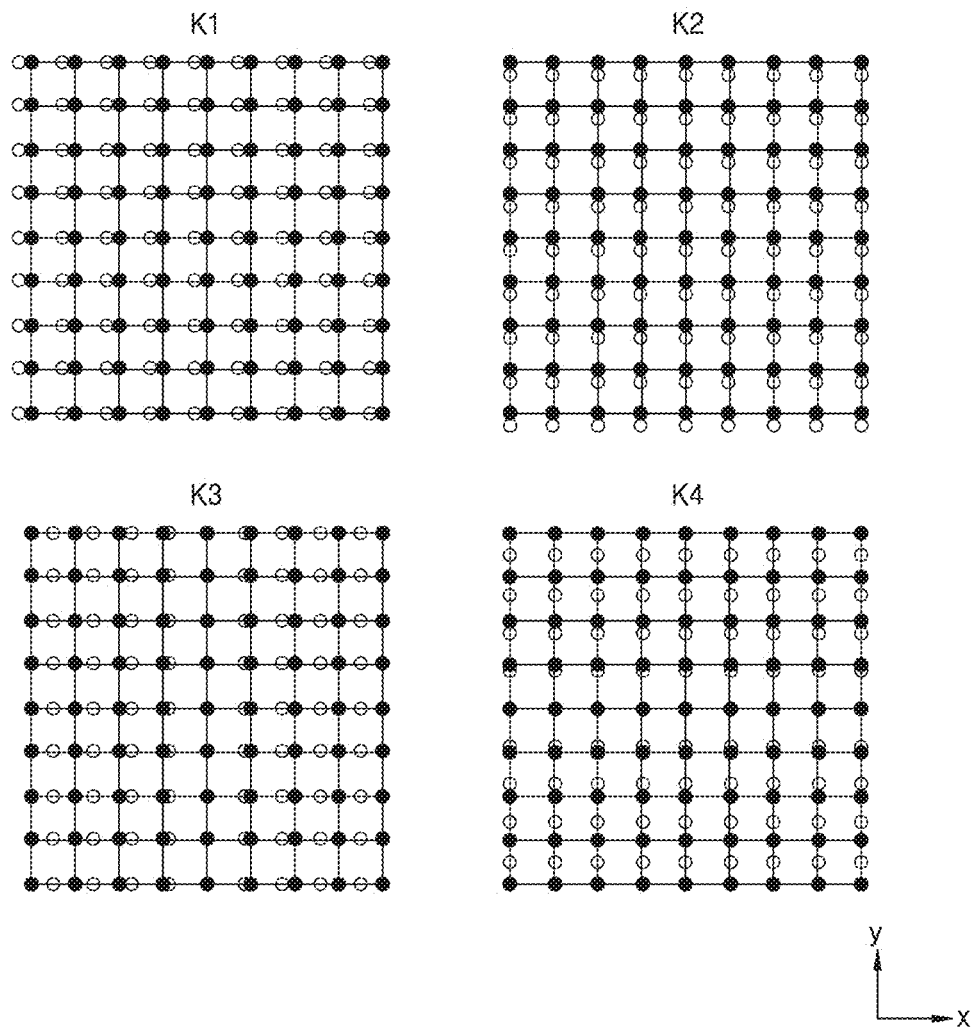
FIGS. 3A to 3C are conceptual views for describing overlay components.
Figure 3B:
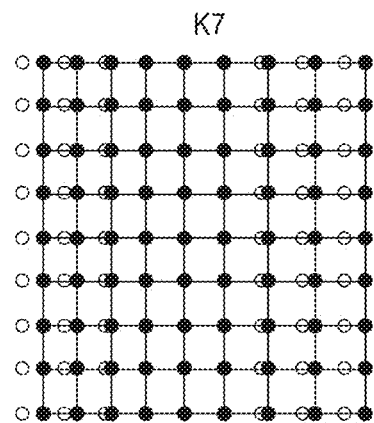
Figure 3B:
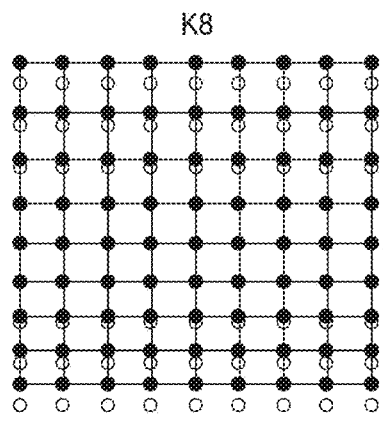
Figure 3B:
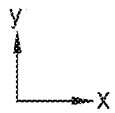
Figure 3C:
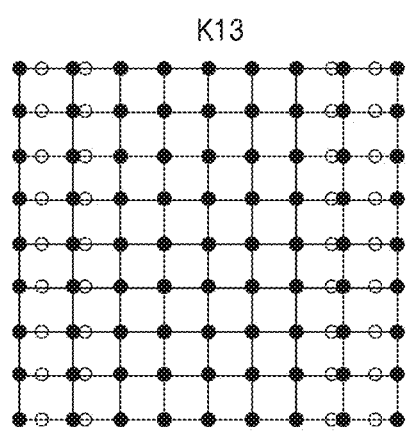
Figure 3C:
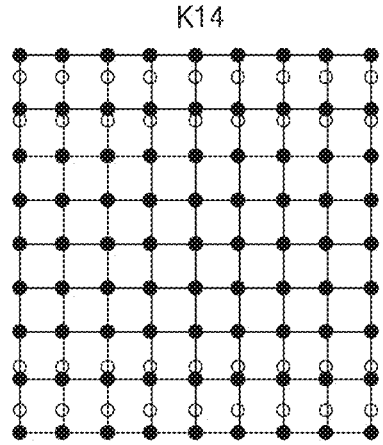
Figure 3C:

FIGS. 3A to 3C are conceptual views for describing overlay components.

Referring to FIG. 3A, linear components corresponding to a first order among overlay error components are illustrated. For example, a K1 component in a left and upper portion may denote a case where an overlay error having a constant size occurs to one side in a first direction (an x direction), and a K2 component may denote a case where an overlay error having a constant size occurs to one side in a second direction (a y direction). When the overlay error in the first direction (the x direction) is referred to as dx and the overlay error in the second direction (the y direction) is referred to as dy, the K1 component may be shown in a form of dx=k1, and the K2 component may be shown in a form of dy=k2. Here, the first direction (the x direction) may be a direction in which a slit disposed under the EUV mask M extends, and the second direction (the y direction) may correspond to a scan direction in the EUV exposure process and may be vertical to the first direction (the x direction).

Moreover, a K3 component in a left and lower portion may denote a case where an overlay error having a size proportional to a position occurs to both sides in the first direction (the x direction), and a K4 component in a right and lower portion may denote a case where an overlay error having a size proportional to a position occurs to both sides in the second direction (the y direction). Therefore, the K3 component may be shown in a form of dx=k3*x, and the K4 component may be shown in a form of dy=k4*y.

Linear components other than the K1 to K4 components may further include a K5 component (not shown) shown in a form of dx=k5*y and a K6 component shown in a form of dy=k5*x.

Referring to FIG. 3B, linear components corresponding to a second order among overlay error components are illustrated. For example, a K7 component in a left portion may denote a case where an overlay error having a size proportional to the square of position occurs to both sides in a first direction (an x direction), and a K8 component in a right portion may denote a case where an overlay error having a size proportional to the square of position occurs to both sides in a second direction (a y direction). Therefore, the K7 component may be shown in a form of $dx=k7*x^2$, and the K8 component may be shown in a form of $dy=k8*y^2$.

Second-order components other than the K7 and K8 components may further include a K9 component (not shown) shown in a form of dx=k9*x*y, a K10 component (not shown) shown in a form of dy=k10*y*x, a K11 component (not shown) shown in a form of $dx=k11*y^2$, and a K12 component (not shown) shown in a form of $dy=k12*x^2$.

Referring to FIG. 3C, linear components corresponding to a third order among overlay error components are illustrated. For example, a K13 component in a left portion may denote a case where an overlay error having a size proportional to position to the third power occurs to both sides in a first direction (an x direction), and a K14 component in a right portion may denote a case where an overlay error having a size proportional to position to the third power occurs to both sides in a second direction (a y direction). Therefore, the K13 component may be shown in a form of $dx=k13*x^3$, and the K14 component may be shown in a form of $dy=k14*y^3$.

Third-order components other than the K13 and K14 components may further include a K15 component (not shown) shown in a form of $dx=k15*x^2*y$, a K16 component (not shown) shown in a form of $dy=k16*y^2*x$, a K17 component (not shown) shown in a form of $dx=k17*x*y^2$, a K18 component (not shown) shown in a form of $dy=k18*y*x^2$, a K19 component (not shown) shown in a form of $dx=k19*y^3$, and a K20 component (not shown) shown in a form of $dy=k20*x^3$.

The K1 to K19 components of the overlay error may be corrected through physical actuation in an ArFi exposure apparatus. Here, the physical actuation may denote a method of providing pressure or tilt to a lens or quickly moving the lens. Further, a method of heating an exposure target (see W of FIG. 1) may be regarded as one of physical actuation methods for correcting an overlay error. Similarly to the ArFi exposure apparatus, the EUV exposure apparatus 100 may correct the K1 to K12 components and the K14 to K19 components of the overlay error through physical actuation. However, as described above, due to an HW difference between the ArFi exposure apparatus and the EUV exposure apparatus 100, the EUV exposure apparatus 100 may hardly correct the K13 component through physical actuation.

Figure 4A:
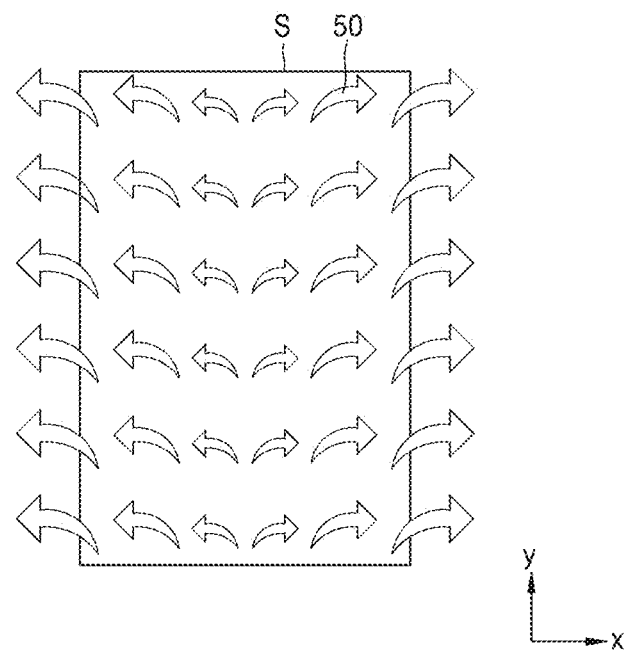
FIGS. 4A and 4B are a vector display diagram and a graph for describing a K13 component of an overlay error, respectively.
Figure 4B:
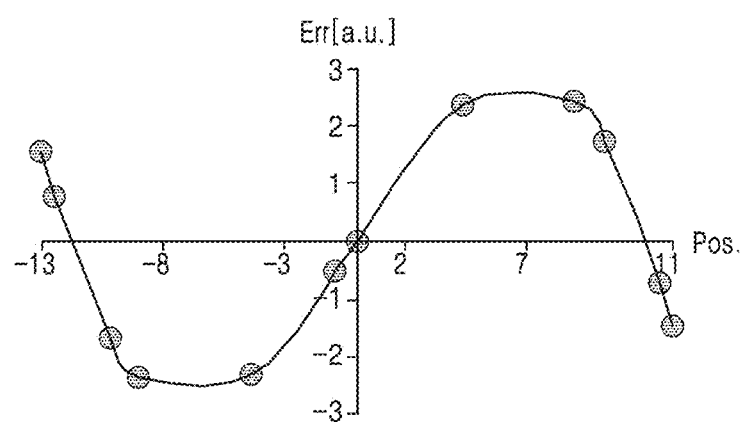

FIGS. 4A and 4B are a vector display diagram and a graph for describing a K13 component of an overlay error, respectively. In the graph of FIG. 4B, the x axis represents a position (Pos.), the y axis represents a size (Err) of an overlay error, and a unit is an arbitrary unit (a.u.) showing only a relative size.

Referring to FIGS. 4A and 4B, a size and a direction of a vector 50 in FIG. 4A may denote a size and a direction of an overlay error caused by the K13 component. For example, a size of an overlay error caused by the K13 component may increase in a direction away from a center in a first direction (an x direction). Further, the size of the overlay error caused by the K13 component may three-dimensionally increase with respect to a position. That is, the size of the overlay error caused by the K13 component may increase in proportion to position to the third power.

FIG. 4B shows that the size of the overlay error caused by the K13 component three-dimensionally increases with respect to a position. For reference, a position on the x axis may correspond to a position in the first direction (the x direction) of FIG. 4A, and −7 and 7 portions where the overlay error is the maximum may be portions corresponding to both sides of a rectangular shape S of FIG. 4A. The rectangular shape S of FIG. 4A may be a shape corresponding to one shot in an exposure process. Therefore, the overlay error is the maximum in portions corresponding to both sides in one shot, and is repeated in the same or substantially similar form in adjacent shots, as shown in FIG. 4B.

The overlay error caused by the K13 component illustrated in FIGS. 4A and 4B may denote an overlay error which is measured between two layers (i.e., an under layer and a current layer) after the under layer is formed through the ArFi exposure process and the current layer, which is an upper layer, is formed through the EUV exposure process. Hereinafter, the overlay error may denote an overlay error between the under layer formed through the ArFi exposure process and the current layer formed through the EUV exposure process.

Figure 5A:
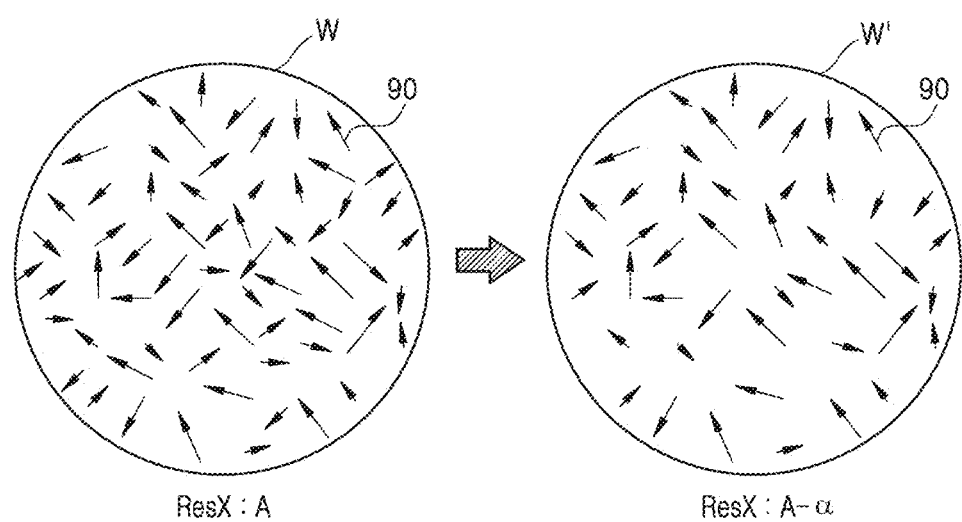
FIGS. 5A and 5B are a conceptual view showing a relationship between a K13 component of an overlay error and residual X and a graph showing a relationship between the K13 component and a residual budget, respectively.
Figure 5B:
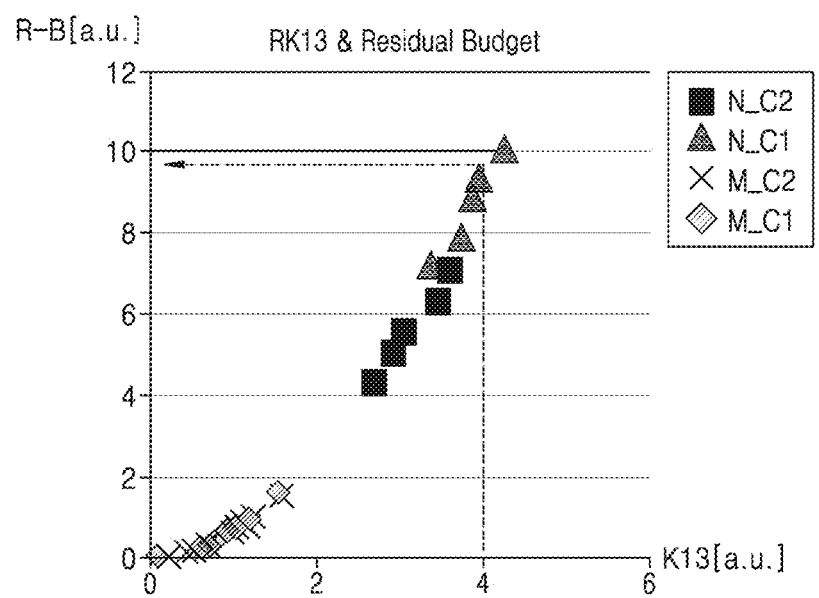

FIGS. 5A and 5B are a conceptual view showing a relationship between a K13 component of an overlay error and residual X (ResX) and a graph showing a relationship between the K13 component and a residual budget, respectively. In FIG. 5B, the x axis represents a K13 component, the y axis represents a residual budget R-B, and a unit of each of the K13 component and the residual budget represents an arbitrary unit.

Referring to FIG. 5A, a left portion shows an example where a residual X value is calculated without correcting the K13 component of the overlay error, and a right portion shows an example where the exposure apparatus 100 according to the present example embodiment corrects the K13 component, and then the residual X value is calculated. Here, a residual may denote an average overlay error value that is calculated after all correctable components among overlay error components are corrected, and the residual X may denote an average overlay error value in a first direction (an x direction). In other words, the left portion shows an example where the residual X is calculated under a condition where the K13 component is regarded as an uncorrectable component, and the right portion shows an example where the residual X is calculated after the exposure apparatus 100 according to the present example embodiment corrects the K13 component as a correctable component.

In each portion of a wafer W, an overlay error is illustrated as a vector 90. In FIG. 5A, the vector 90 corresponding to the overlay error is relatively large, but a large number of vectors 90 corresponding to overlay errors may appear on the wafer W to have a very fine size. It is illustrated that, as the K13 component is corrected, a vector 90 on a right wafer W' becomes smaller or is removed, and thus the residual X may be reduced from A to A-α. Therefore, the residual X may be improved by correcting the K13 component. Further, when the K13 component is large, a degree of improvement of the residual X based on correction of the K13 component may increase even further. A difference (for example, the a) of the residual X associated with the correction of the K13 component may be referred to as an overlay penalty caused by the K13 component or a residual budget.

Referring to FIG. 5B, as a value of the K13 component increases, the residual budget may increase exponentially. An exposure apparatus and a chuck each used in an EUV exposure process are differentiated from each other and illustrated in a right box. That is, N and M are for differentiating EVU exposure apparatuses used in the EUV exposure process, and c1 and c2 are for differentiating chucks disposed in the EUV exposure apparatuses, respectively. As seen in the graph, it may be seen that a relationship between the K13 component and the residual budget is irrelevant to the kinds of the EUV exposure apparatuses and the chucks. Thus, when the K13 component is small, there is no problem, but when the K13 component increases, the residual budget may rapidly increase, thereby causing more defects of semiconductor devices in a wafer and causing a considerable reduction in a yield rate.

Figure 6:
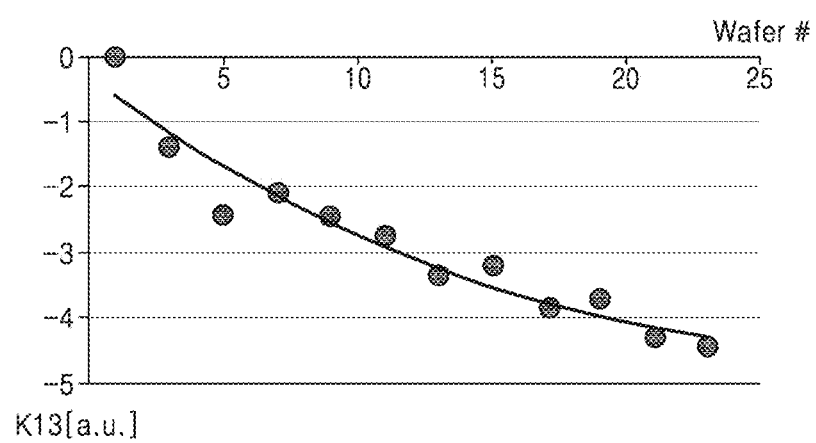
FIG. 6 is a graph showing a K13 component variation of an overlay error with respect to a wafer, based on a progress of an exposure process.

FIG. 6 is a graph showing a K13 component variation of an overlay error with respect to a wafer based on a progress of an exposure process. In FIG. 6, the x axis represents numbers (Wafer #) of wafers in order in which an EUV exposure process is performed on the wafers in the same EUV exposure apparatus, they axis represents a K13 component of each of the wafers, and a unit may be an arbitrary unit.

Referring to FIG. 6, as a number of a wafer increases, the K13 component may increase. Here, a size of the K13 component may be determined as an absolute value. An increase in the K13 component caused by an increase in a wafer number may be caused by non-uniform heating by EVU of mirrors (e.g., at least one mirror of projection optics) of the EUV exposure apparatus. In other words, mirrors of the projection optics (see 130 of FIG. 1) may have a uniform temperature distribution when EUV exposure starts. However, due to an illumination shape of EUV that is structurized through reflection by the EUV mask M while the EUV exposure is being performed, non-uniform heating may occur in some regions of at least one mirror of the projection optics 130. Therefore, a corresponding mirror may non-uniformly expand in each region and may cause a tilt defect and/or an aberration of a mirror surface, which may cause an overlay error having the K13 component. Further, as a wafer number increases, such a phenomenon may increase more. Thus, as shown in the graph, as a wafer number increases, the K13 component may increase.

Figure 7A:
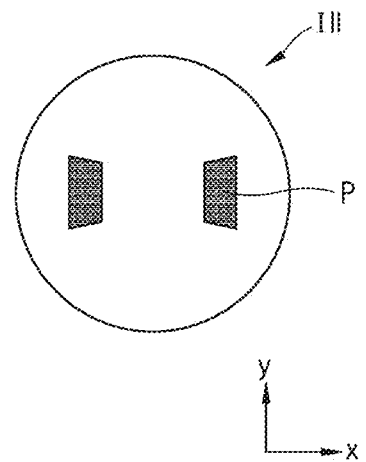
FIGS. 7A and 7B are graphs showing an illumination shape of EUV by an EUV mask, a shape of EUV irradiated onto a mirror, and a temperature profile corresponding thereto.
Figure 7B:
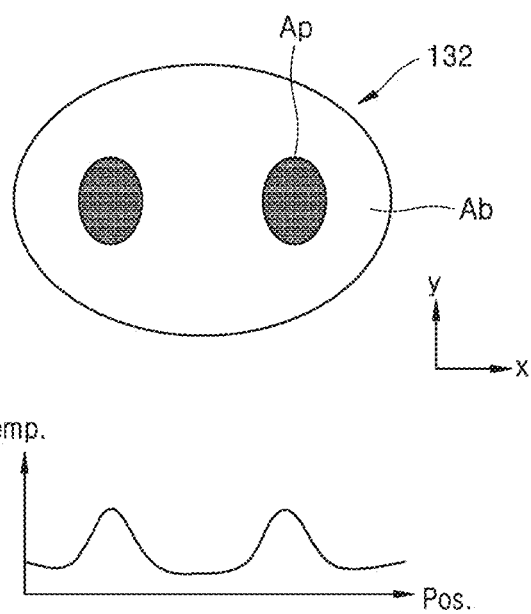

FIGS. 7A and 7B are graphs showing an illumination shape of EUV by an EUV mask, a shape of EUV irradiated onto a mirror, and a temperature profile corresponding thereto. In the graph, the x axis represents a position (Pos.) in a first direction (an x direction) corresponding to a mirror, the y axis represents a temperature (Temp.), and a unit may be an arbitrary unit.

Referring to FIG. 7A, EUV reflected by an EUV mask (see M of FIG. 1) may have a dipole illumination shape I11 as illustrated. A hatched portion P may correspond to poles on which EUV concentrates. The dipole illumination shape may enable a line and space (L/S) pattern to be easily formed on an exposure target (see W of FIG. 1). The dipoles may be disposed in the first direction (the x direction), but the present example embodiment is not limited thereto. In other example embodiments, the dipoles may be disposed in a second direction (a y direction) by changing a shape of a pattern on the EUV mask M or by rotating the EUV mask M. Furthermore, the EUV may have various structurized illumination shapes such as circular illumination, annular illumination, and quadrupole illumination by changing a shape of the pattern on the EUV mask M.

Referring to FIG. 7B, EUV having a dipole illumination shape may be irradiated onto at least one mirror (for example, the first mirror 132) of projection optics (see 130 of FIG. 1). In the first mirror 132, the EUV may have an illumination shape shown in FIG. 7B. In FIG. 7B, the first mirror 132 is illustrated in an elliptical shape, but the present example embodiment is not limited thereto. In other example embodiments, the first mirror 132 may have a circular shape. Further, a pole region Ap corresponding to a pole may have a circular shape or a shape the same as or substantially similar to a shape of a dipole shown in FIG. 7A, instead of an elliptical shape.

As seen in a graph shown in a lower portion of FIG. 7B, a temperature may be high in the pole region Ap corresponding to the pole, and may be low in a peripheral region Ab outside of the pole region Ap. Due to an illumination shape of a dipole reflected by the EUV mask M, the first mirror 132 may have a non-uniform temperature distribution in each region thereof. Therefore, as described above, the first mirror 132 may act as a cause of a K13 component of an overlay error. The present example embodiment is not limited to the dipole illumination shape, and the first mirror 132 may have a non-uniform temperature distribution in each region thereof due to various illumination shapes. Due to this, the first mirror 132 may act as the cause of the K13 component of the overlay error.

FIGS. 8A to 8D are conceptual views of optical devices included in the second illumination optics 150 in the EUV exposure apparatus 100 of FIG. 1.

Figure 8A:
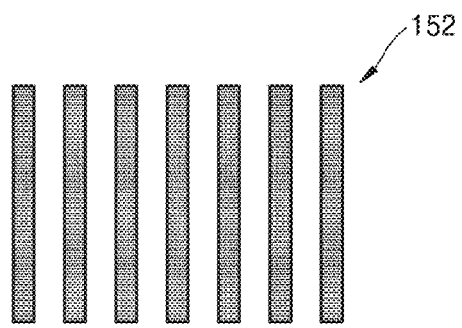
FIGS. 8A to 8D are conceptual views of optical devices included in a second illumination optics in the EUV exposure apparatus of FIG. 1.

Referring to FIG. 8A, an optical device 152 included in the second illumination optics 150 may be implemented with L/S binary gratings. The optical device 152 having an L/S binary grating structure may process a laser beam of the laser source 140 in order for the laser beam to have a dipole illumination shape. The optical device 152 may change an interval between the L/S binary gratings to adjust an interval between dipoles of dipole illumination. In some example embodiments, the optical device 152 may rotate a direction in which the L/S binary gratings are arranged by, for example, 90 degrees, thereby allowing the dipoles of the dipole illumination to be arranged in the second direction (the y direction).

Figure 8B:
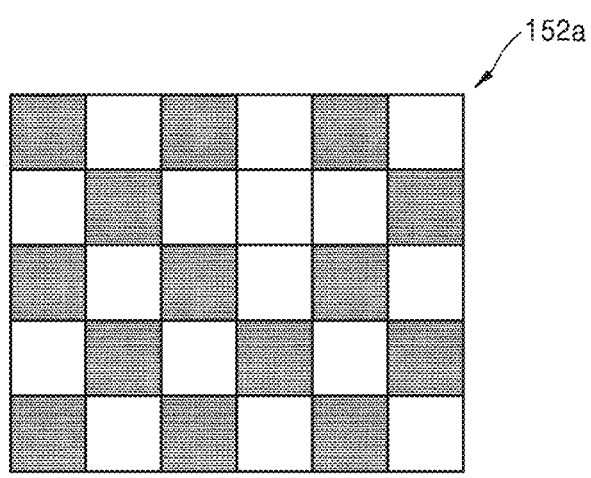

Referring to FIG. 8B, an optical device 152a included in the second illumination optics 150 may be implemented with chess board (CB) binary gratings. The optical device 152a having a CB binary grating structure may process the laser beam of the laser source 140 in order for the laser beam to have a quadrupole illumination shape. The optical device 152a may change an interval between the CB binary gratings to adjust an interval between quadrupoles of quadrupole illumination. In some example embodiments, the optical device 152a may rotate a direction in which the CB binary gratings are arranged by, for example, 45 degrees, thereby allowing the quadrupoles of the quadrupole illumination to be disposed in a 45-degree-rotated direction. In other example embodiments, the optical device 152a may be implemented with mesh binary gratings, and the optical device 152a may process the laser beam by using the mesh binary gratings in order for the laser beam to have a quadrupole illumination shape.

In FIGS. 8A and 8B, two optical devices 152 and 152a respectively having the L/S binary grating structure and the CB binary grating structure are illustrated, but a grating structure of an optical device is not limited thereto. For example, an optical device may be implemented in various grating structures in addition to the above-described grating structures, and process the laser beam of the laser source 140 in order for the laser beam to have other various pole illumination shapes, based on the various grating structures.

Figure 8C:
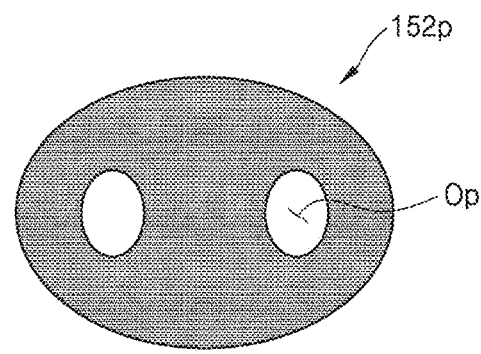

Referring to FIG. 8C, an optical device 152b included in the second illumination optics 150 may be implemented as a slit plate including an open region Op corresponding to a dipole. The laser beam of the laser source 140 may pass through the optical device 152b having a slit plate structure to have a dipole illumination shape. Two open regions Op may be provided in the slit plate that is the optical device 152b based on a dipole, but the position or number of open regions Op of the slit plate is not limited thereto. For example, the position or the number of open regions Op of the slit plate that is the optical device 152b may be variously changed based on a desired illumination shape of a laser beam.

Figure 8D:
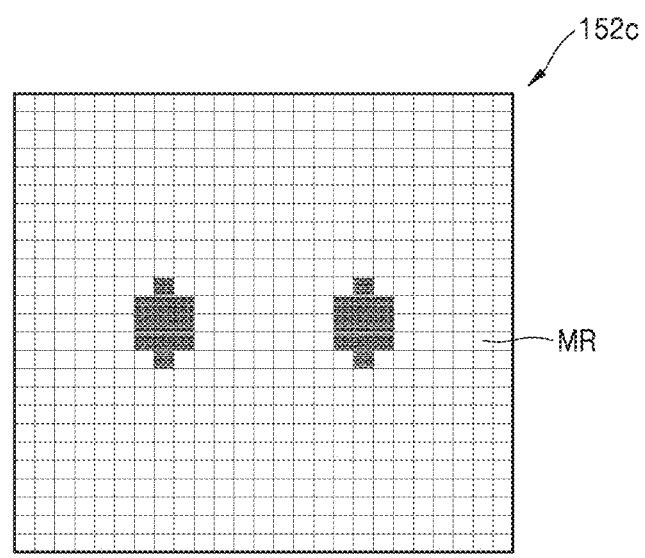

Referring to FIG. 8D, an optical device 152c included in the second illumination optics 150 may be implemented as a digital micro-mirror device (DMD). However, the optical device 152c is not limited to a DMD, and may be implemented as another kind of spatial light modulator (SLM). For example, the optical device 152c may be implemented as a grating light valve (GLV), an electro-optical device using lead (plomb) lanthanum zirconate titanate (PLZT), a ferroelectric liquid crystal (FLC), or the like.

The optical device 152c having a DMD structure may include a device substrate, a plurality of memory cells (for example, static random access memory (SRAM) cells) provided on the device substrate, and a plurality of micro-mirrors MR which are arranged in a two-dimensional (2D) array structure on the memory cells. For example, the optical device 152c may include "1920*1080" micro-mirrors MR having the 2D array structure. The arrangement and number of micro-mirrors MR are not limited thereto. In other example embodiments, a material such as aluminum having a high reflectivity may be deposited on a surface of each of the micro-mirrors MR. For example, a reflectivity of each of the micro-mirrors MR may be 90% or more. Also, a lengthwise length and a widthwise length of each of the micro-mirrors MR may be the same as or substantially similar to each other and may each be several to tens μm.

When a digital signal is applied to the memory cell of the optical device 152c, each of the micro-mirrors MR may be inclined within a certain angle range with respect to a surface of the device substrate. For example, the certain angle range may be a range of ±12 degrees. However, a range of a slope is not limited to a range of ±12 degrees. A slope of each of the micro-mirrors MR may be controlled, and thus, a laser beam incident on the optical device 152c may be reflected in a certain direction, based on the slope of each of the micro-mirrors MR. Therefore, the laser beam may be processed to have various illumination shapes, based on a selection of each of the micro-mirrors MR and may be irradiated onto at least one mirror (for example, a first mirror (see 132 of FIG. 1) of the projection optics 130. In FIG. 8D, a hatched portion represents a selected micro-mirror MR, and the laser beam of the laser source 140 may be processed to have a dipole illumination shape by using the selected micro-mirror MR. However, a shape of the laser beam based on processing by the optical device 152c is not limited to the dipole illumination shape. In other example embodiments, by appropriately selecting at least one micro-mirror from among the micro-mirrors MR, the optical device 152c may process the laser beam to have various illumination shapes.

Figure 9A:
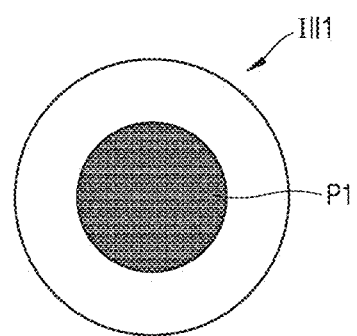
FIGS. 9A to 9C are conceptual views showing an illumination shape of a laser beam based on processing by a second illumination optics.
Figure 9B:
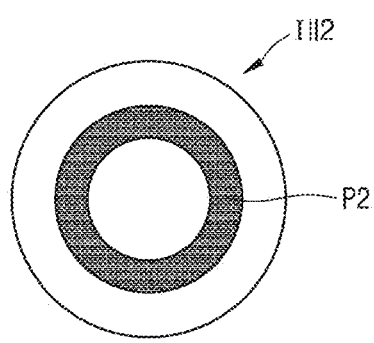
Figure 9C:
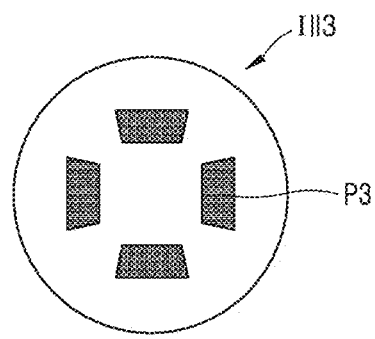

FIGS. 9A to 9C are conceptual views showing an illumination shape of a laser beam based on processing by the second illumination optics 150.

Referring to FIG. 9A, a laser beam of the laser source 140 may be processed by the second illumination optics 150 to have a circular illumination shape Ill1. A hatched portion P1 may correspond to a portion on which the laser beam concentrates. For example, the laser beam may be processed by an optical device of the second illumination optics 150 to have the circular illumination shape Ill1. As described above with reference to FIGS. 8A to 8D, the optical device may be implemented as, for example, a binary grating, a slit plate, or a DMD. For example, the optical device 152b having a slit plate structure where one open hole Op is provided in a center thereof may process the laser beam to have the circular illumination shape Ill1. In some example embodiments, the optical device 152c having a DMD structure may process the laser beam to have the circular illumination shape Ill1 by appropriately selecting at least one mirror from among the micro-mirrors MR.

Referring to FIG. 9B, a laser beam of the laser source 140 may be processed by the second illumination optics 150 to have an annular illumination shape Ill2. A hatched portion P2 may correspond to a portion on which the laser beam concentrates. For example, the laser beam may be processed by an optical device implemented as, for example, a binary grating, a slit plate, or a DMD to have the annular illumination shape Ill2 For example, the optical device 152b having a slit plate structure where an open hole Op having an annular shape is provided in an outer portion thereof may process the laser beam to have the annular illumination shape Ill2 Also, by appropriately selecting at least one micro-mirror from among the micro-mirrors MR, the optical device 152c having a DMD structure may process the laser beam to have the annular illumination shape Ill2 Furthermore, the laser beam may be processed to have an annular illumination shape having two or more rings, based on a grating structure such as a circular zone plate.

Referring to FIG. 9C, a laser beam of the laser source 140 may be processed by the second illumination optics 150 to have a quadrupole illumination shape Ill3. A hatched portion P3 may correspond to a pole on which the laser beam concentrates. For example, the laser beam may be processed by an optical device implemented as, for example, a binary grating, a slit plate, or a DMD to have the quadrupole illumination shape Ill3. For example, the optical device 152b having a slit plate structure where four open holes Op corresponding to a quadrupole is provided in an outer portion thereof may process the laser beam to have the quadrupole illumination shape Ill3. In some example embodiments, the optical device 152c having a DMD structure may process the laser beam to have the quadrupole illumination shape Ill3 by appropriately selecting at least one micro-mirror from among the micro-mirrors MR. Furthermore, the optical device 152a having a CB binary grating structure or a mesh binary grating structure may process the laser beam to have the quadrupole illumination shape Ill3.

According to some example embodiments, the laser beam of the laser source 140 may be processed by the second illumination optics 150 to correspond to an illumination shape of EUV structurized through reflection by the EUV mask M. For example, in a case where the EUV is structurized through reflection by the EUV mask M to have a dipole illumination shape, the laser beam may be processed by the second illumination optics 150 to have the dipole illumination shape. In a case where the EUV is structurized through reflection by the EUV mask M to have a quadrupole illumination shape, the laser beam may be processed by the second illumination optics 150 to have the quadrupole illumination shape.

According to some example embodiments, the laser beam of the laser source 140 may be processed by the second illumination optics 150 to have an illumination shape that is opposite to (e.g., a negative shape of) an illumination shape of the EUV structurized through reflection by the EUV mask M. For example, in a case where the EUV is structurized through reflection by the EUV mask M to have the dipole illumination shape, the laser beam may be processed by the second illumination optics 150 to have an illumination shape where light concentrates on a region around a dipole.

FIGS. 10A to 10D are conceptual views for describing the principle of heating a mirror with a laser beam in the EUV exposure apparatus 100 of FIG. 1.

Referring to FIGS. 10A to 10D, a temperature sensor 170 may be disposed on a rear surface of at least one mirror (for example, the first mirror 132) of the projection optics 130. Also, the EUV L1 of the EUV source 110 and the laser beam L2 of the laser source 140 may be simultaneously or sequentially irradiated onto the first mirror 132. The laser beam L2 having appropriate energy may be irradiated onto an appropriate position of the first mirror 132 based on temperature information about the first mirror 132 obtained by the temperature sensor 170 and a desired amount of energy or a temperature distribution of the first mirror 132 based on the temperature information.

Figure 10A:
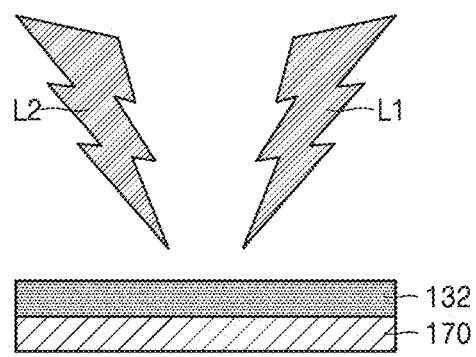
FIGS. 10A to 10D are conceptual views for describing the principle of heating a mirror with a laser beam in the EUV exposure apparatus of FIG. 1.
Figure 10B:
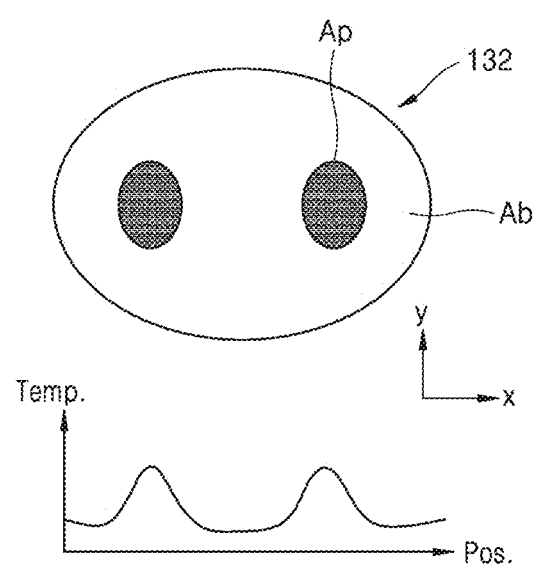
Figure 10C:
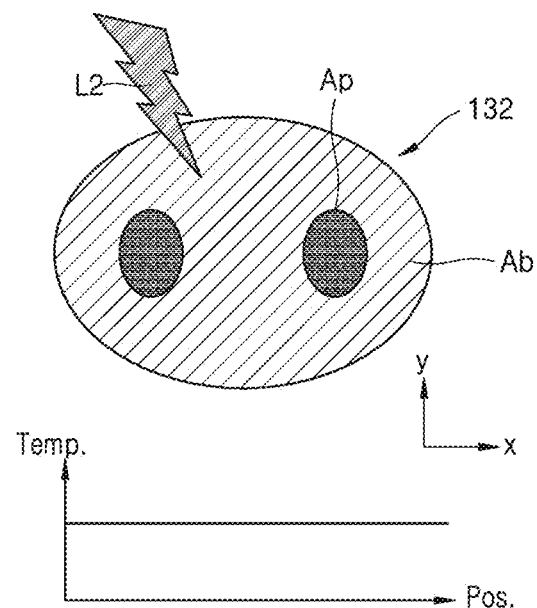
Figure 10D:
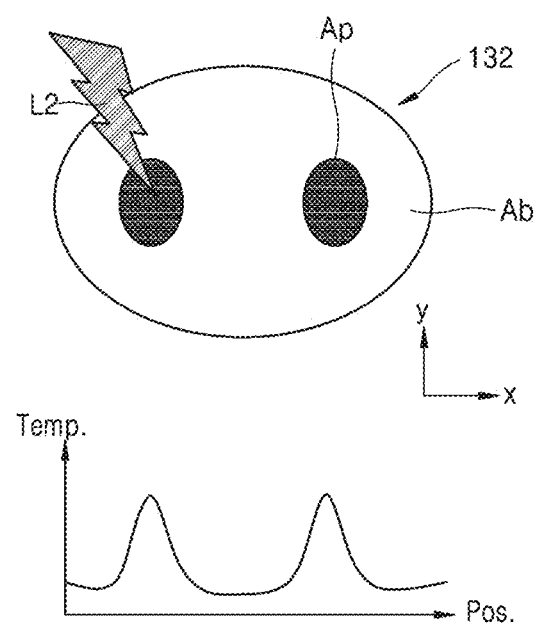

For example, in a state where the laser beam L2 is not irradiated, a temperature distribution of the first mirror 132 is shown as in a graph of the lower portion of FIG. 10B, and a K13 component of an overlay error occurs due to the temperature distribution of the first mirror 132. In this case, the second illumination optics 150 may process the laser beam L2 to have an illumination shape (e.g., an illumination shape where the laser beam L2 concentrates on a peripheral region Ab other than a pole region Ap) which is opposite to (e.g., a negative shape of) the dipole illumination shape, and by heating the first mirror 132 with the laser beam L2 having the illumination shape, an entire temperature distribution of the first mirror 132 may be uniform as shown in a graph of the lower portion of FIG. 10C. Accordingly, the K13 component of the overlay error that occurs due to an EUV concentration on the pole region AP may be corrected.

Moreover, the K13 component of the overlay error may occur due to a cause different from the above-described cause. For example, in a case where the EUV exposure apparatus 100 is set to maintain a certain temperature difference between the peripheral region Ab and the pole region Ap of the first mirror 132 considering the K13 component of the overlay error, a desired temperature difference is not maintained (e.g., the amount of EUV concentrating on the pole region Ap may be insufficient), and thus the K13 component of the overlay error may occur. In this case, the second illumination optics 150 may process the laser beam L2 to have a dipole illumination shape, and by heating the first mirror 132 with the laser beam L2 having the dipole illumination shape, the temperature difference between the peripheral region Ab and the pole region Ap of the first mirror 132 may increase to a desired level. Accordingly, the K13 component of the overlay error that occurs because the EUV concentrating on the pole region AP is insufficient may be corrected.

Hereinabove, correction performed on the K13 component of the overlay error has been described above, but by irradiating a laser beam onto at least one mirror of a projection optics to heat the at least one mirror may correct other components of the overlay error that is different from the K13 component. A correction method (for example, a physical actuation method) of correcting the other components, other than the K13 component, of the overlay error may be installed in the EUV exposure apparatus 100, and the other components, other than the K13 component, of the overlay error may be sufficiently corrected by the physical actuation method. Therefore, in a case where the EUV exposure apparatus 100 is designed to perform the physical actuation method on the other components of the overlay error, a correction method of heating a mirror with a laser beam may be omitted on the other components of the overlay error. However, in some example embodiments, the other components of the overlay error may be corrected by simultaneously performing the physical actuation method and the correction method of heating the mirror with the laser beam.

FIGS. 11 and 12 are flowcharts illustrating procedures of an EUV exposure method according to some example embodiments. Hereinafter, the EUV exposure method according to the present example embodiment will be described with reference to FIGS. 11 and 12 in conjunction with FIG. 1, and descriptions given above with reference to FIGS. 1 to 10D will be briefly given or will be omitted.

Referring to FIG. 11, in the EUV exposure method according to the present example embodiment, the EUV source 110 may first generate and output the EUV L1 in operation S110. The EUV L1 may have, for example, a high energy density within a wavelength range of about 5 nm to about 50 nm. For example, in the EUV exposure method according to the present example embodiment, the EUV L1 may have, for example, a high energy density corresponding to a wavelength of 13.5 nm.

Subsequently, in operation S120, the first illumination optics 120 may transfer the EUV L1 to the EUV mask M. A plurality of mirrors included in the first illumination optics 120 may reflect the EUV L1 to allow the EUV L1 to be incident on the EUV mask M.

Subsequently, in operation S130, the projection optics 130 may project the EUV L1, reflected by the EUV mask, onto the wafer W which is the exposure target W. The EUV L1 may be structurized in a certain illumination shape through reflection by the EUV mask M, based on a pattern on the EUV mask M. The EUV L1 having the certain illumination shape may non-uniformly heat at least one mirror (for example, the first mirror 132) of the projection optics 130, and due to this, a temperature distribution of the first mirror 132 may be non-uniform, causing an exposure defect and a K13 component of an overlay error. Projection of the EUV L1 by the projection optics 130 onto the wafer W may denote projection of the EUV L1 onto a photoresist on the wafer W.

Subsequently, in operation S135, whether to correct the K13 component of the overlay error may be determined. Whether to correct the K13 component of the overlay error may be determined based on whether the K13 component of the overlay error exceeds a threshold or predetermined criterion.

When the K13 component of the overlay error does not need to be corrected (No), the EUV exposure method may end.

Otherwise, when the K13 component of the overlay error need to be corrected (Yes), the laser source 140 may generate and output the laser beam L2 for heating in operation S140. The laser beam L2 may be, for example, an IR laser beam or an UV laser beam. However, a kind of the laser beam L is not limited thereto. For example, the laser beam L2 may be a laser beam L2 having a wavelength which does not change chemical properties of the photoresist on the waver W which is the exposure target W.

Subsequently, in operation S150, the second illumination optics 150 may irradiate the laser beam L2 onto a mirror of the projection optics 130. The laser beam L2 may be processed by the second illumination optics 150 to have various illumination shapes. That is, the laser beam L2 may be processed by an optical device, such as a binary grating, a slit plate, or a DMD, of the second illumination optics 150 to have various illumination shapes such as dipole illumination, quadrupole illumination, circular illumination, and annular illumination. The laser beam L2 may have an illumination shape corresponding to a portion, which is to be heated, of a mirror onto which the laser beam L2 is irradiated. For example, in a case where the EUV L1 having the dipole illumination shape is irradiated onto a mirror and the laser beam L2 has to be irradiated onto a region other than two pole regions, the laser beam L2 may be processed by the second illumination optics 150 to have an illumination shape where light concentrates on a region around a dipole.

After operation S150 of irradiating the laser beam L2 onto the mirror, the EUV exposure method may end. According to some example embodiments, whether to perform an exposure process on another wafer may be determined before the EUV exposure method ends, and when the exposure process performed on the other wafer is not needed, the EUV exposure method may end.

Referring to FIG. 12, the EUV exposure method according to the present example embodiment may be similar to the EUV exposure method of FIG. 11. However, the EUV exposure method according to the present example embodiment may further include operation S137 of measuring, by using the temperature sensor 170, a temperature of a portion or an entirety of the mirror and operation S139 of calculating the amount of energy which is to be applied to the mirror, between operation S135 of determining whether to correct the K13 component and operation S140 of generating and outputting the laser beam L2.

In operation S137 of measuring a temperature, the amount of energy applied to the mirror (for example, the first mirror 132) by the EUV L1 or a region-based temperature distribution of the first mirror 132 may be calculated based on temperature information obtained through the temperature sensor 170. Also, in operation S139 of calculating the amount of energy, positions of regions of the first mirror 132 to which energy is to be applied may be determined, and the amount of energy which is to be applied to a corresponding position by the laser beam L2 may be calculated. Subsequently, in operation S150 of irradiating the laser beam L2 onto the mirror, the laser beam L2 may be processed by the second illumination optics 150, and the laser beam L2 having an appropriate amount of energy may be irradiated onto desired regions of the first mirror 132.

FIG. 13 is a flowchart illustrating a procedure of a method of manufacturing a semiconductor device by using the exposure method of FIG. 11. Hereinafter, the EUV exposure method according to the present example embodiment will be described with reference to FIG. 13 in conjunction with FIG. 1, and descriptions given above with reference to FIGS. 11 and 12 will be briefly given or will be omitted.

Referring to FIG. 13, the exposure method of FIG. 11 may be performed. For example, operations S210 to S250 including operation S210 of generating and outputting the EUV L1 to operation S250 of irradiating the laser beam L1 onto the mirror may be performed. The method of manufacturing a semiconductor device according to the present example embodiment may perform the exposure method of FIG. 12 instead of the exposure method of FIG. 11.

Subsequently, in operation S260, the wafer W (e.g., the exposure target W) may be patterned based on exposure. Here, the exposure may correspond to operation S230 of irradiating the EVU L1 onto the wafer W. As described above, projection of the EUV L1 onto the wafer W may denote an operation of irradiating the EUV L1 onto a pattern material (for example a photoresist) coated on the wafer W. After an exposure process based on the exposure method of FIG. 11, a real pattern which is to be formed on the wafer W may be formed through a develop process and an etch process.

Subsequently, in operation S270, a subsequent semiconductor process may be performed on the wafer W. The subsequent semiconductor process may include various processes. For example, the subsequent semiconductor process may include a deposition process, an etch process, an ion process, a cleaning process, etc. Also, the subsequent semiconductor process may include a singulation process of individualizing the wafer W into semiconductor chips, a test process of testing the semiconductor chips, and a packaging process of packaging the semiconductor chips. A semiconductor device may be finished through the subsequent semiconductor process performed on the wafer W.

In the method of manufacturing a semiconductor device by using the exposure method according to the present example embodiment, an optimal exposure process of minimizing an overlay error may be performed based on a method of heating a portion of a mirror with the laser beam L2, and thus, a semiconductor device which is low in error rate and is enhanced in reliability may be manufactured, thereby considerably enhancing a yield rate.

As described above, the EUV exposure apparatus and the exposure method according to the example embodiments may heat at least one mirror of the projection optics with a laser beam by using the laser apparatus, thereby minimizing an overlay error caused by the mirror. For example, the EUV exposure apparatus and the exposure method according to the example embodiments may heat a portion of the at least one mirror of the projection optics with the laser beam by using the illumination optics of the laser apparatus, thereby minimizing an overlay error caused by a non-uniform temperature distribution of the mirror in the EUV exposure process.

Moreover, in the method of manufacturing a semiconductor device by using the exposure method according to the example embodiments, the optimal exposure process for minimizing an overlay error may be performed based on a method of heating a portion of the mirror with the laser beam in an exposure step, and thus, a semiconductor device which is low in error rate and is enhanced in reliability may be manufactured, thereby considerably enhancing a yield rate.

While the inventive concepts have been particularly shown and described with reference to embodiments thereof, it will be understood that various changes in form and details may be made therein without departing from the spirit and scope of the following claims.

What is claimed is:

1. An extreme ultraviolet (EUV) exposure method comprising:
generating and outputting, by using an EUV source, EUV;
transferring, by using first illumination optics, the EUV to an EUV mask;
projecting, by using projection optics, the EUV reflected from the EUV mask onto an exposure target;
generating and outputting, by using laser apparatus, a laser beam;
forming, by using second illumination optics, an illumination shape of the laser beam; and
irradiating the laser beam having the illumination shape onto at least one mirror included in the projection optics,
wherein the irradiating the laser beam comprises heating, by using the laser beam, a first portion or a second portion of the at least one mirror through the second illumination optics to compensate for a component of an overlay error between layers of the exposure target, the first portion being one portion of the at least one mirror, the second portion being another portion of the at least one mirror that is other than the first portion, when an error associated with the component three-dimensionally increases as a position distances from a center to both sides in a first direction, the first direction being perpendicular to a scan direction in an exposure process.

2. The EUV exposure method of claim 1, wherein the irradiating the laser beam comprises heating, by using the laser apparatus, a portion of the at least one mirror through the second illumination optics.

3. The EUV exposure method of claim 1, further comprising:
before the generating and outputting of the laser beam, measuring, by using a temperature sensor attached on a rear surface of the at least one mirror, a temperature of a portion or an entirety of the at least one mirror; and
calculating an amount of energy to be applied to the at least one mirror based on the measured temperature,
wherein the irradiating the laser beam comprises irradiating the laser beam having the calculated amount of energy to the at least one mirror by using the laser apparatus.

4. The EUV exposure method of claim 3, wherein
the calculating the amount of energy comprises determining a first portion of the at least one mirror, the first portion being a portion to which the laser beam is to be applied, and
the irradiating the laser beam comprises irradiating the laser beam onto the determined first portion through the second illumination optics by using the laser apparatus.

5. The EUV exposure method of claim 1, wherein
the irradiating the laser beam comprises forming the illumination shape of the laser beam by using at least one of a binary grating, a slit plate, or a digital micro-mirror device (DMD) by using the second illumination optics, and
the forming the illumination shape of the laser beam comprises at least one of
processing the laser beam to form the illumination shape to be one of circular illumination, annular illumination, dipole illumination, or quadrupole illumination, or
processing the laser beam to form the illumination shape to have a negative shape of one of the circular illumination, the annular illumination, the dipole illumination, or the quadrupole illumination.

6. A method of manufacturing a semiconductor device, the method comprising:

generating and outputting, by using an extreme ultraviolet (EUV) source, EUV;
transferring, by using first illumination optics, the EUV to an EUV mask;
projecting, by using projection optics, the EUV reflected from the EUV mask onto a wafer, the wafer being an exposure target;
generating and outputting, by using laser apparatus, a laser beam;
forming, by using second illumination optics, an illumination shape of the laser beam;
irradiating the laser beam having the illumination shape onto at least one mirror included in the projection optics;
patterning the wafer; and
performing a subsequent semiconductor process on the wafer,
wherein the irradiating the laser beam comprises calculating an amount of energy to be applied to the at least one mirror by using a temperature sensor attached on a rear surface of the at least one mirror.

7. The method of claim 6, wherein the irradiating the laser beam comprises heating a portion of the at least one mirror through the second illumination optics by using the laser apparatus.

8. The method of claim 6, wherein the irradiating the laser beam comprises:
determining a first portion by using the temperature sensor attached on the rear surface of the at least one mirror, the first portion being a portion to which the laser beam is to be applied; and
calculating the amount of energy to be applied to the first portion.

* * * * *